United States Patent [19]

Ohta et al.

[11] Patent Number: 4,966,095
[45] Date of Patent: Oct. 30, 1990

[54] APPARATUS FOR FORMING A THIN FILM

[75] Inventors: Wasaburo Ohta; Masashi Nakazawa, both of Yokohama, Japan

[73] Assignee: Ricoh Company, Ltd., Tokyo, Japan

[21] Appl. No.: 392,099

[22] Filed: Aug. 10, 1989

[30] Foreign Application Priority Data

Aug. 15, 1988 [JP] Japan .................................. 63-202862

[51] Int. Cl.⁵ .............................................. C23C 16/50
[52] U.S. Cl. ................................ 118/723; 204/298.05; 427/38
[58] Field of Search .................... 118/723; 204/192.31, 204/298; 427/38

[56] References Cited

U.S. PATENT DOCUMENTS 4,854,265 8/1989 Ohta et al. ........................... 118/723
4,876,984 10/1989 Kinoshita et al. .................... 118/723

FOREIGN PATENT DOCUMENTS 62-227084 10/1987 Japan ..................................... 204/298
63-125672 5/1988 Japan ..................................... 204/298

Primary Examiner—Richard Bueker
Assistant Examiner—Terry J. Owens
Attorney, Agent, or Firm—Cooper & Dunham

[57] ABSTRACT

An apparatus for forming a thin film comprises a vacuum container evacuated to high vacuum and receiving a gas for vapor deposition, a source of evaporation in the container for evaporating a substance, a counter electrode in the container holding a substrate to be vapor-deposited such that the substrate opposes the source, a filament disposed between the source and the electrode for generating thermions, and a grid disposed between the filament and the electrode for allowing the evaporated substance to pass therethrough and accelerating the evaporated substance. An electrical potential power supply is connected to the electrode, the filament and the grid for maintaining the grid at a positive potential with respect to the electrode and the filament, and an electrical heating power supply is connected to the grid for supplying the grid with an electrical power so as to electrically heat the grid. A cover which surrounds the source, filament, and grid and which has an opening facing the electrode may be provided in the container to enable a stable plasma and uniform thin film to be obtained regardless of any change in the shape, size, or material of the container.

9 Claims, 5 Drawing Sheets

APPARATUS FOR FORMING A THIN FILM

BACKGROUND OF THE INVENTION

The present invention relates to an apparatus for forming a thin film suitable for use in production of semiconductor devices such as ICs and LSIs.

Conventionally, various apparatus and methods have been known such as CVD and PVD methods and apparatus. In general, CVD method provides a high reactivity, while PVD enables formation of a fine strong thin film in a highly evacuated atmosphere.

One type of apparatus for forming a thin film is known which has a source of evaporation, a counter electrode holding a substrate on which a thin film is to be formed by vapor deposition such that the substrate opposes the source, a grid disposed between the source and the counter electrode, and a filament disposed between the grid and the source for generating thermions, wherein the grid is held at a positive potential with respect to the filament during the operation. This type of apparatus is disclosed, for example, in Japanese patent application Laying Open No. 59-89763.

In this type of apparatus, the substance evaporated from the source is ionized by the thermions emitted from the filament. The ionized substance is then accelerated upon passing through the grid by an electric field which is directed towards the electrode, so that the ionized substance is collided with and deposited on the substrate whereby a film with a high degree of adhesion to the substrate is formed on the substrate.

The above mentioned type of apparatus, however, suffers from the following disadvantages. Namely, when a thin insulating film is formed on the substrate, the grid also is coated with an insulating film, with the result that dielectric breakdown between the grid and the filament or between the grid and the counter electrode happens so that the desired reacting condition in the vacuum container can no more be maintained, with the result that formation of a uniform thin film is failed. The same problem is encountered also when a thin conductive film is formed subsequently to the formation of a thin insulating film in the same apparatus. Namely, during the formation of the thin conductive film, the dielectric breakdown happens to fail the formation of a uniform thin film.

In addition, the known apparatus for forming a thin film has encountered the problems of the adhesion between the substrate and the thin film formed thereon being insufficient and of difficulty in forming a film on a substrate which is made of a material having a relatively small heat-resistance, e.g., plastics.

Furthermore, in the known apparatus for forming a thin film, characteristics of the thin film formed on a substrate tend to change when the configuration and/or the size of the vacuum container are changed, even when factors such as shapes of the source of evaporation, filament, grid and the counter electrode and, spacings and electrical conditions of these components are unchanged.

SUMMARY OF THE INVENTION

A first object of the present invention is to provide an apparatus for forming a thin film which is capable of forming a uniform thin film on a substrate with a high degree of adhesion to the substrate.

A second object of the present invention is to provide an apparatus for forming a thin film which is capable of forming a uniform thin film on a substrate with a high degree of adhesion to the substrate and which can be easily adapted to meet the needs of a large-scale apparatus for mass-production of devices having such a uniform thin film on the substrate such as semiconductor devices.

According to the present invention, the first object can be achieved by a first apparatus for forming a thin film comprising a vacuum container evacuated to high vacuum and receiving a gas for vapor deposition therein;

a source of evaporation disposed in the container for evaporating a substance to be evaporated;

a counter electrode disposed in the container and holding a substrate to be vapor-deposited such that the substrate opposes the source;

a filament disposed between the source and the electrode for generating thermions;

a grid disposed between the filament and the electrode for allowing the evaporated substance to pass therethrough and accelerating the evaporated substance;

an electrical potential power supply connected to the electrode, the filament and the grid for maintaining the grid at a positive potential with respect to the electrode and the filament; and an electrical heating power supply connected to the grid for supplying the grid with an electrical power so as to electrically heat the grid.

According to the first apparatus of the present invention, the grid is electrically heated by the electrical power supplied by the heating power supply while the grid is maintained at a positive potential with respect to the filament and the counter electrode by the potential power supply so that an electric field formed between the grid and the filament is directed from the grid toward the filament, whereby deposition of insulating material on the grid is avoided. Accordingly, the plasma state around the grid is maintained stable without the dielectric breakdown so that a thin film is formed uniformly on the substrate with a high degree of adhesion to the substrate.

According to the present invention, the second object can be achieved by a second apparatus for forming a thin film comprising:

a vacuum container evacuated to high vacuum and receiving a gas for vapor deposition therein;

a source of evaporation disposed in the container for evaporating a substance to be evaporated;

a counter electrode disposed in the container and holding a substrate to be vapor-deposited such that the substrate opposes the source;

a filament disposed between the source and the electrode for generating thermions;

a grid disposed between the filament and the electrode for allowing the evaporated substance to pass therethrough and accelerating the evaporated substance;

an electrical potential power supply connected to the electrode, the filament and the grid for maintaining the grid at a positive potential with respect to the electrode and the filament;

an electrical heating power supply connected to the grid for supplying the grid with an electrical power so as to electrically heat the grid; and a cover disposed in the container for surrounding the source, the filament, and the grid, the cover provided with an opening at a side facing the electrode.

According to the second apparatus of the present invention, since the cover provided with the opening at the side facing the electrode surrounds the source, the filament and the grid, the ionization rate of the evaporated substance and the plasma state around the grid are unchanged regardless of any change in the shape and the size of the container, accordingly, in addition to the above-mentioned advantages of the first apparatus, the second apparatus can be easily adapted to meet the needs of a large-scale apparatus for mass-production of devices having a thin film such as semiconductor devices.

As the gas for vapor deposition of the present invention, an active gas, an inert gas and a mixture of the active gas and the inert gas can be used.

As the heating power supply of the present invention, an A.C. power supply or a D.C. power supply can be used.

As for the electrical connection of the heating power supply and the potential power supply of the present invention, those power supplies can be connected in parallel or in series to the grid. In case those power supplies are connected in parallel, a switch may be provided such that those power supplies are alternatively connected to the grid.

Further objects and advantages of the present invention will be apparent from the following description of the preferred embodiments of the present invention as illustrated in the accompanying drawings.

DESCRIPTION OF THE PREFERRED EMBODIMENTS

Preferred embodiments of the present invention will be described with reference to the accompanying drawings.

Figure 1:
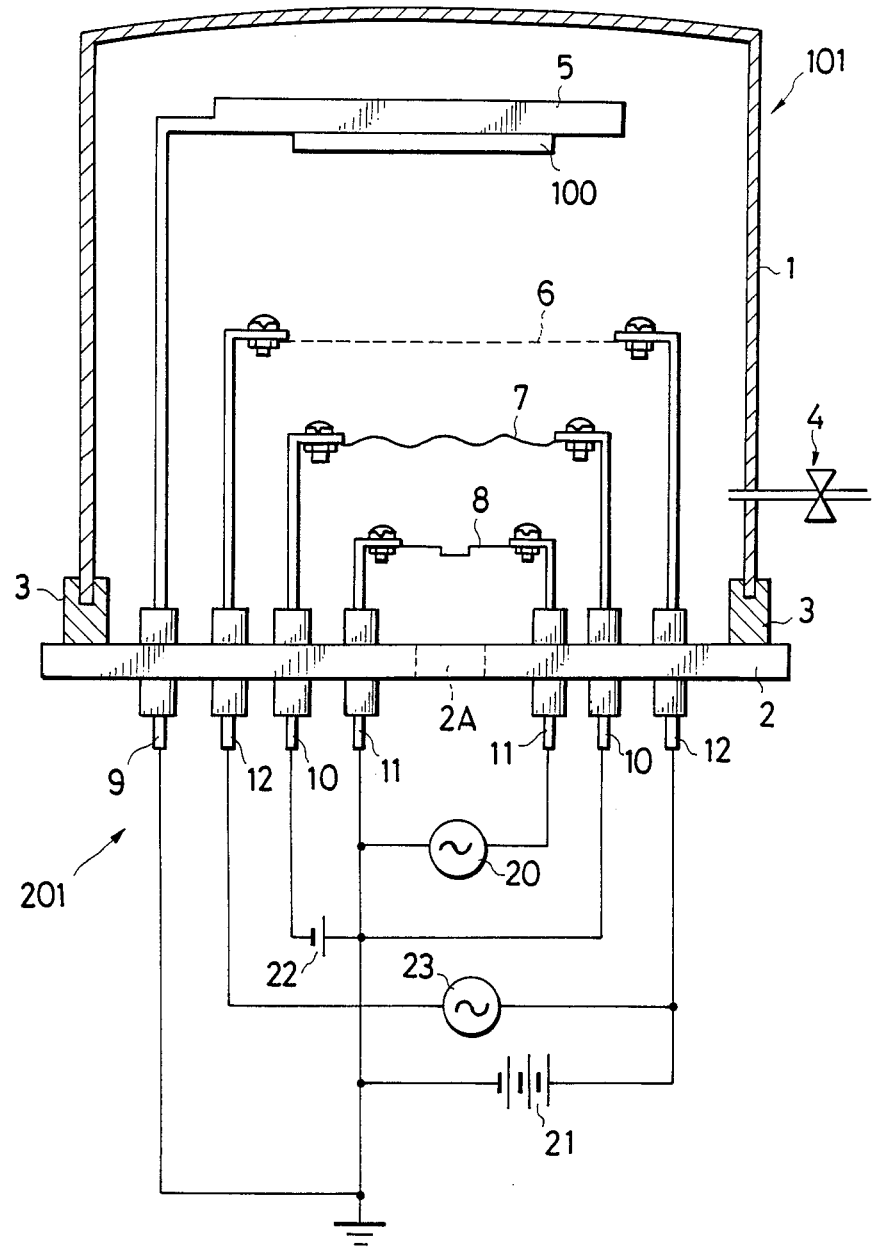
FIG. 1 is a schematic sectional view of a first embodiment according to the first apparatus of the present invention.

Referring to FIG. 1 which shows a first embodiment according to the first apparatus of the present invention, a vacuum vessel 101 is composed of a bell jar 1 and a base plate 2 which are coupled to each other through a packing 3. The internal space of the vessel 101 is supplied with an active gas, an inert gas or a mixture of an active gas and an inert gas, through a known gas supplying means 4.

The base plate 2 is provided at the center thereof with a hole 2A which is connected to a vacuum system which is not shown. An electrode 9 and pairs of electrodes 10, 11 and 12, which also serve as support members, are disposed at the vessel 101 in such a manner that they gas-tightly penetrate the base plate 2 of the vessel 101 and that they are electrically insulated from the base plate 102. These electrodes 9, 10, 11 and 12 also compose a part of electrical connection means 201 which provides electrical connection between the interior components and the exterior components of the vessel 101. The pair of electrodes 11 support, between their ends inside the vessel 101, a resistance-heating type source 8 of evaporation in the form of a boat made of a metallic material such as tungsten, molybdenum or the like. The source 8, however, may have the form of a coil rather than a boat. It is also possible to use, as the source 8, an electron beam type source of evaporation which is used in a conventional vacuum vapor deposition method.

The pair of electrodes 10 support, between their ends inside the vessel 101, a filament 7 made of, for example, tungsten for generating thermions. The filament 7 is composed of a plurality of tungsten wires arranged in parallel or in a network-like form so as to cover the spread of the particles of the substance evaporated from the source 8.

Similarly, the pair of electrodes 12 support, between their ends inside the vessel 101, a grid 6 having a configuration which allows the evaporated substance to pass therethrough towards a counter electrode 5. In the illustrated case, the grid 6 has a network-like form. An A.C. power supply 23, serving as a electrical heating power supply for the grid 6, is connected between the ends of the pair of electrodes 12 outside the vessel 101. The heating power supply for the grid 6, however, may be a D.C. power supply. When a D.C. power supply is used, there is no restriction as to the polarity of connection.

The electrode 9 supports, at its end inside the vessel 101, the counter electrode 5 such that the electrode 5 opposes the source 8. Suitable holding means for holding a substrate 100 on which a thin film of the evaporated substance is to be formed is provided on the surface of the electrode 5 opposing the source 8. It is not essential that the electrode 9 is grounded, although it is grounded n the illustrated arrangement.

A source heating power supply 20 is connected to the pair of electrodes 11 which support the source 8. The power supply 20 may be either an A.C. power supply or a D.C. power supply, as is the case of the power supply 23.

A power supply 22 is connected to the pair of electrodes 10 supporting the filament 7. This power supply 22 also may be either an A.C. power supply or a D.C. power supply.

One of the electrodes 12 supporting the grid 6 is connected to the plus terminal of a D.C. power supply 21 while the minus terminal of the D.C. power supply 21 is connected to one of the electrodes 10. With this arrangement, the grid 6 is held at a positive potential with respect to the filament 7 so that an electric field directed from the grid 6 towards the filament 7 is formed therebetween.

In the illustrated arrangement, the D.C. power supply 21 is directly grounded at its minus terminal. This arrangement, however, is only illustrative and this grounding is not necessary. The arrangement may be such that the minus terminal of the power supply 21 is grounded through a suitable D.C. power supply so that a bias is applied to both or either one of the source 8 and the filament 7.

With the above-mentioned apparatus of the present invention, a stable plasma can be formed in the vessel 101 by suitably controlling the power supply 22 for heating the filament 7 and the D.C. power supply 21 for the grid 6. In addition, since the grid 6 is heated by the power supplied from the power supply 23, it is possible to avoid undesirable deposition of the insulating material to the grid 6 during an insulating thin film formation. This enables the plasma to be maintained stable, thus contributing to the formation of a uniform thin film.

The electrical connection between the respective electrodes 9, 10, 11 and 12 and the associated power supplies 20, 21, 22 and 23 are actually made through known switches which are parts of the electrical connection means 201 and which are operated sequentially so as to execute a predetermined vapor deposition process. These switches, however, are omitted from the drawings for the purpose of clarification of the drawings.

The process for forming a thin film with the apparatus shown in FIG. 1 will be described below.

Referring to FIG. 1, the substrate 100 is held by the electrode 5, while the source 8 serving as the evaporation material is disposed between the pair of electrodes 11. The kind of the evaporation material is selected suitably in accordance with the kind of the thin film to be formed on the substrate 100. Then, an active gas, an inert gas or a mixture of these gases is introduced into the vessel 101 through the gas supplying means 4 at a pressure of 10 to $10^{-3}$ Pa. It is assumed here that the gas introduced into the vessel 101 is an active gas, e.g., oxygen gas.

In this state, the aforementioned switches are suitably operated so that the source 8 is heated to cause the evaporation material to evaporate. The particles of the evaporated substance are made to fly towards the substrate 100 in a wide-spreading manner and pass through the grid 6. Part of the particles of the evaporated substance, passing through the grid 6, are made to attach to the grid 6 as they are or in the form of a compound.

On the other hand, the filament 7 emits thermions. The emitted thermions are accelerated by the electric field formed by the grid 6 so as to fly towards the grid 6. During flying, the thermions collide with the molecules of the gas introduced into the vessel 101, as well as with the particles of the evaporated substance so as to ionize these molecules and particles into plus ions, whereby a plasma state is realized in the vicinity of the grid 6.

The ionized particles of the evaporated substance and the ionized molecules of the introduced gas are accelerated by the action of the electric field which is directed towards the electrode 5 so as to fly at high velocity into collision with the substrate 100, thereby forming the desired thin film on the substrate 100.

In the case where the thin film formed on the substrate is an insulating thin film, there is a risk that the insulating substance is deposited on the grid 6 with the result that the dielectric breakdown is caused between the grid 6 and the filament 7 or between the grid 6 and the electrode 5 thereby to make the plasma unstable. This problem, however, can be overcome in this embodiment because the grid 6 is electrically heated by the power supply 23 so as to allow the particles of the evaporated substance attached on the grid to fly towards the substrate 100 without forming an undesirable insulating film on the grid. Thus, in this embodiment, it is possible to form a desired thin film on the substrate.

When a conductive thin film is to be formed subsequently to the insulating thin film, the insulating substance deposited on the grid 6, if any, can be removed as the grid 6 is electrically heated during and/or after the formation of the insulating thin film. The subsequent formation of conductive film, therefore, can be conducted in a stable plasma state.

The thin film thus formed exhibits a high degree of adhesion to the substrate 100, as well as high degree of crystallinity and crystal orientation, because it is formed as a result of collision of ion particles onto the substrate 100.

When the gas introduced into the vessel 101 is an active gas or a mixture gas of an active gas and an inert gas, the active gas reacts with the evaporated substance so that a film of a reaction product is formed on the substrate. In the first embodiment, the evaporated substance is ionized at an extremely high rate of ionization at a high degree of stability, so that a thin film of the compound having a desired substance can be formed easily and securely.

For instance, when a mixture gas of argon as an inert gas and oxygen as an active gas is introduced into the vessel 101 at a pressure of 10 to $10^{-2}$ Pa, while aluminum is used as the evaporation material, it is possible to form an insulating thin film of aluminum oxide on the substrate 100. Similarly, when silicon or silicon monooxide is used as the evaporation material, an insulating thin film of silicon dioxide is formed on the substrate 100. Conversely, when indium or tin is selected as the evaporation material, a conductive thin film such as of indium oxide or tin oxide is formed on the substrate. It is also possible to obtain a thin film of titanium oxide or tantalum oxide, by using an active gas such as nitrogen gas or ammonia gas together with argon gas while using titanium or tantalum as the evaporation material. It is also possible to form a multi-layered film such as $SiO_2$/$In_2O_3$/$SiO_2$ on the substrate 100, by using silicon oxide and indium as the evaporation materials in the same apparatus.

Because the thermions emitted from the filament 7 effectively contribute to the ionization of the evaporated substance and the gas introduced into the vessel 101, the ionization of the evaporated substance is possible even under a high degree of vacuum of not more than $10^{-3}$ Pa, so that trapping of the gas molecules into the thin film can be remarkably reduced so as to ensure high degrees of purity and fineness of the formal thin film. In general, it is considered that the density of thin film is smaller than that of the bulk. According to the first embodiment, however, it is possible to obtain a thin film which has a density well approximating that of the bulk. Thus, the first embodiment of the present invention is highly suitable to the production of the semiconductor devices such as ICs and LSIs.

Figure 2:
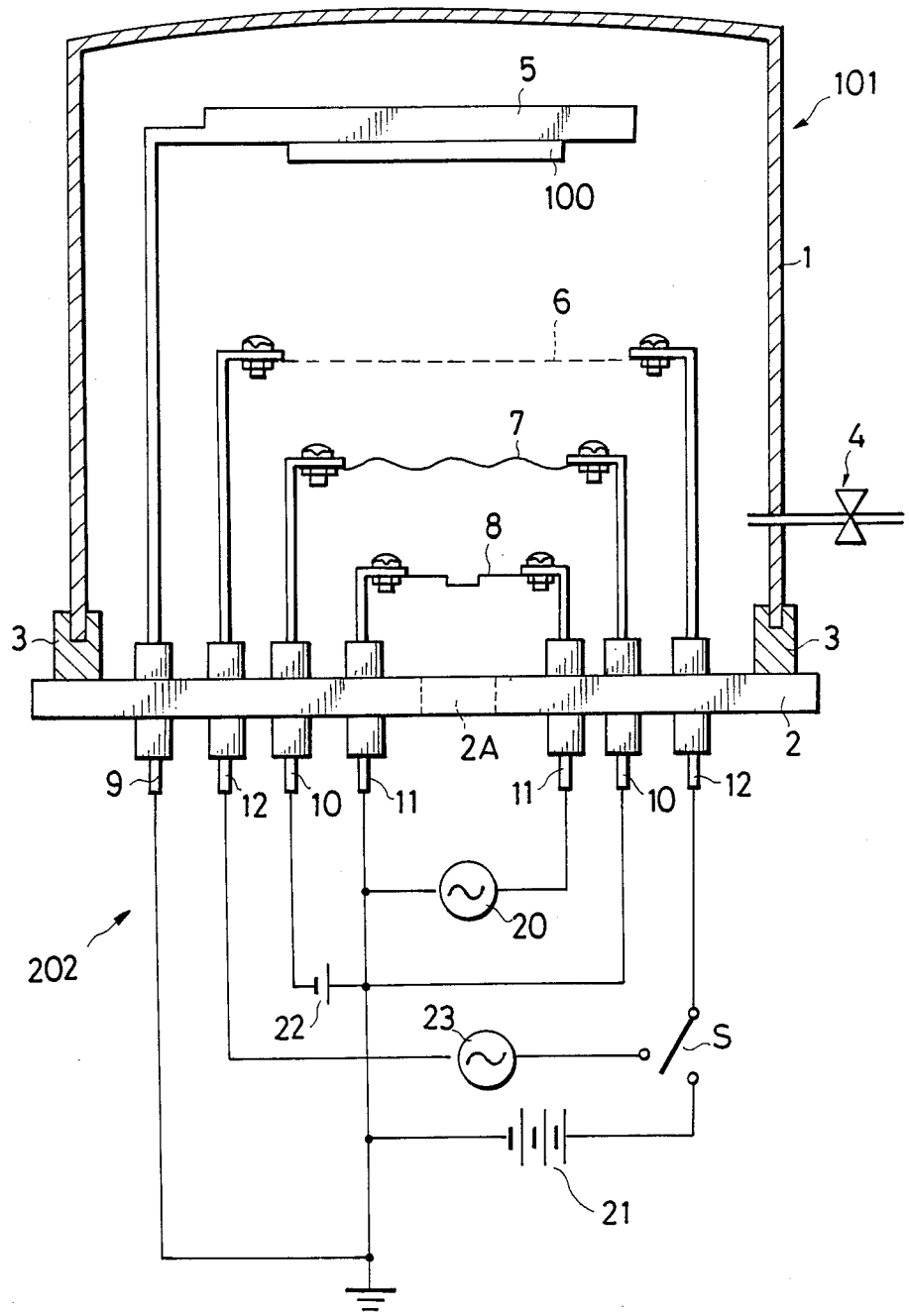
FIG. 2 is a schematic sectional view of a second embodiment according to the first apparatus of the present invention.

FIG. 2 shows a second embodiment according to the first apparatus of the present invention. In FIG. 2, the same reference numerals are used for the same component as those in FIG. 1, and explanations of such components are omitted.

The electrical connection means 202 in the second embodiment has a switch S through which the A.C. power supply 23 as the electrical heating power supply for the grid 6 is connected to the grid 6. The switch S is so constructed that the power supply 21 is not connected to the grid 6 when the grid 6 is connected to the power supply 23. Accordingly, while an insulating thin film is being formed by the apparatus of the second embodiment, the power supply 21 is connected to the grid 6 so that the predetermined potential relationship is established. Then, after the formation of the insulating thin film, the switch S is turned to connect the power supply 23 to the grid 6 so as to electrically heat the grid 6, thereby removing any deposited insulating material from the grid 6.

Figure 3:
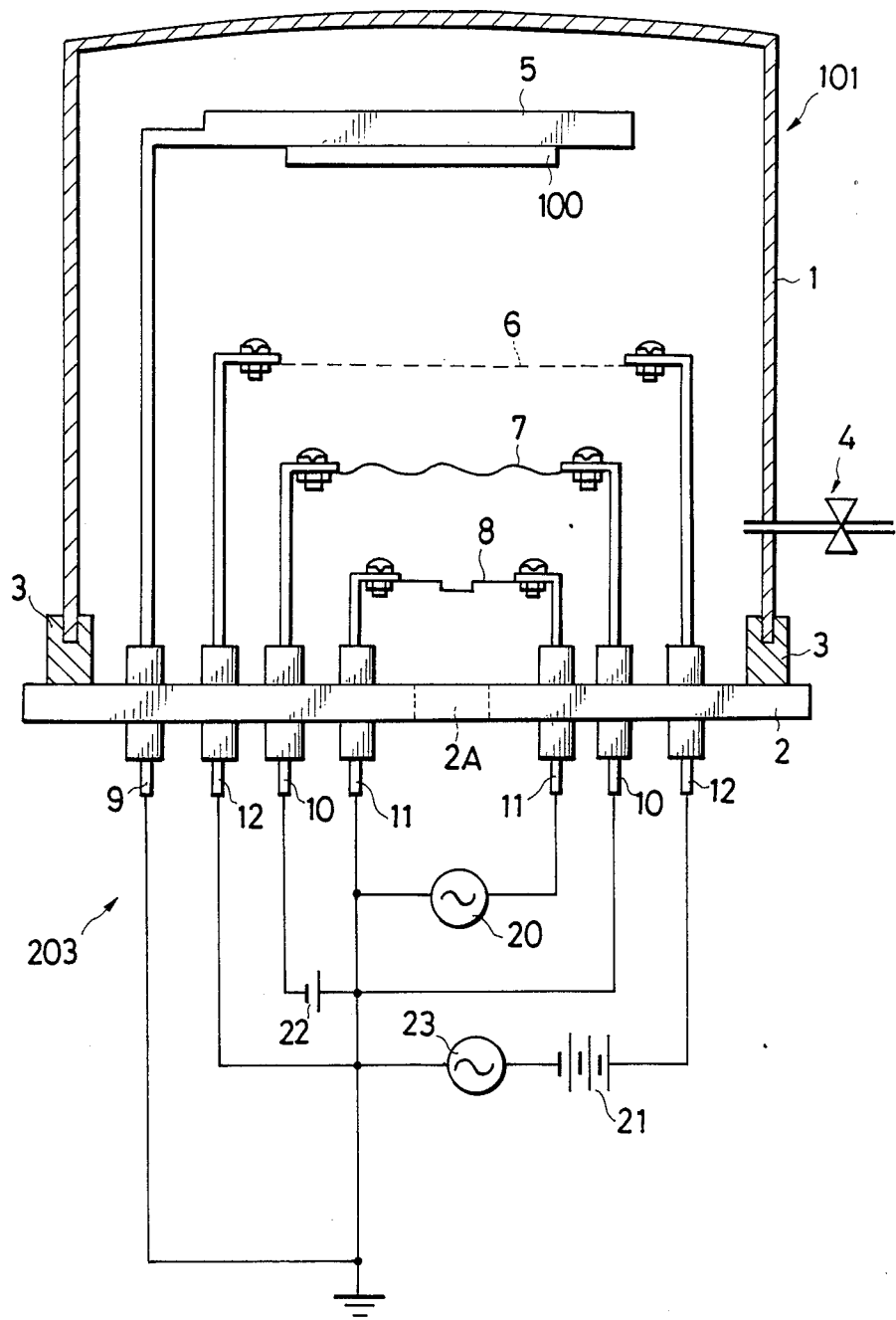
FIG. 3 is a schematic sectional view of a third embodiment according to the first apparatus of the present invention.

FIG. 3 shows a third embodiment according to the first apparatus of the present invention. In FIG. 3, the same reference numerals are used for the same components as those in FIG. 1, and explanations of such components are omitted.

The electrical connection means 203 of the third embodiment is constructed such that the A.C. power supply 23 as the electrical heating power supply is connected in series to the power supply 21 so that an A.C. component produced by the power supply 23 is superimposed to the D.C. component produced by the power supply 21. In the third embodiment, therefore, the grid 6 is electrically heated by the power supply 23 so as to remove the insulating substance from the grid 6 during the formation of the insulating thin film. In the third embodiment, the electrical connection means 203 may be modified such that the power supply 21 and the power supply 23 are replaced with each other.

Figure 4:
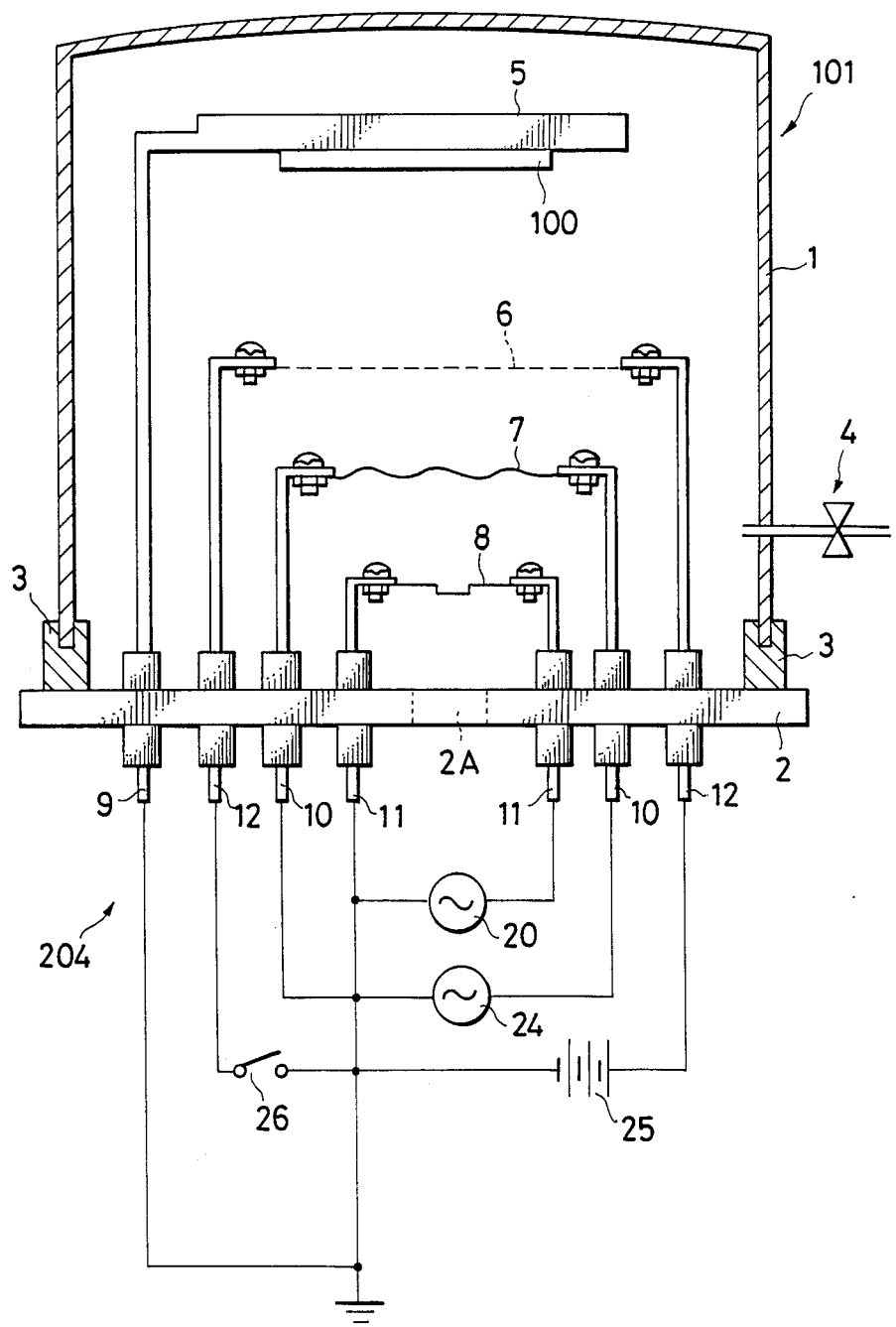
FIG. 4 is a schematic sectional view of a fourth embodiment according to the first apparatus of the present invention.

FIG. 4 shows a fourth embodiment according to the first apparatus of the present invention. In FIG. 4, the same reference numerals are used for the same components as those in FIG. 1, and explanations of such components are omitted.

The electrical connection means 204 of the fourth embodiment is constructed such that a common D.C. power supply 25 is provided as the electrical heating power supply and as the electrical potential power supply. One of the electrodes 12 is connected to the minus terminal of the power supply 25 through a switch 26. The electrode 5 and the filament 7 are connected to the minus terminal of the power supply 25. The minus terminal of the power supply 25, the electrode 5 and the filament 7 are grounded. There is also provided an A.C. power supply 24 connected to the pair of electrodes 10 for heating the filament 7. In the fourth embodiment, therefore, the grid 6 is maintained at a positive potential with respect to the filament 7 and the electrode 5 by the power supply 25 during the formation of the insulating thin film when the switch 26 is opened, while the grid 6 can be electrically heated by the power supply 25 when the switch 26 is closed, thereby removing any deposited insulating material from the grid 6.

Figure 5:
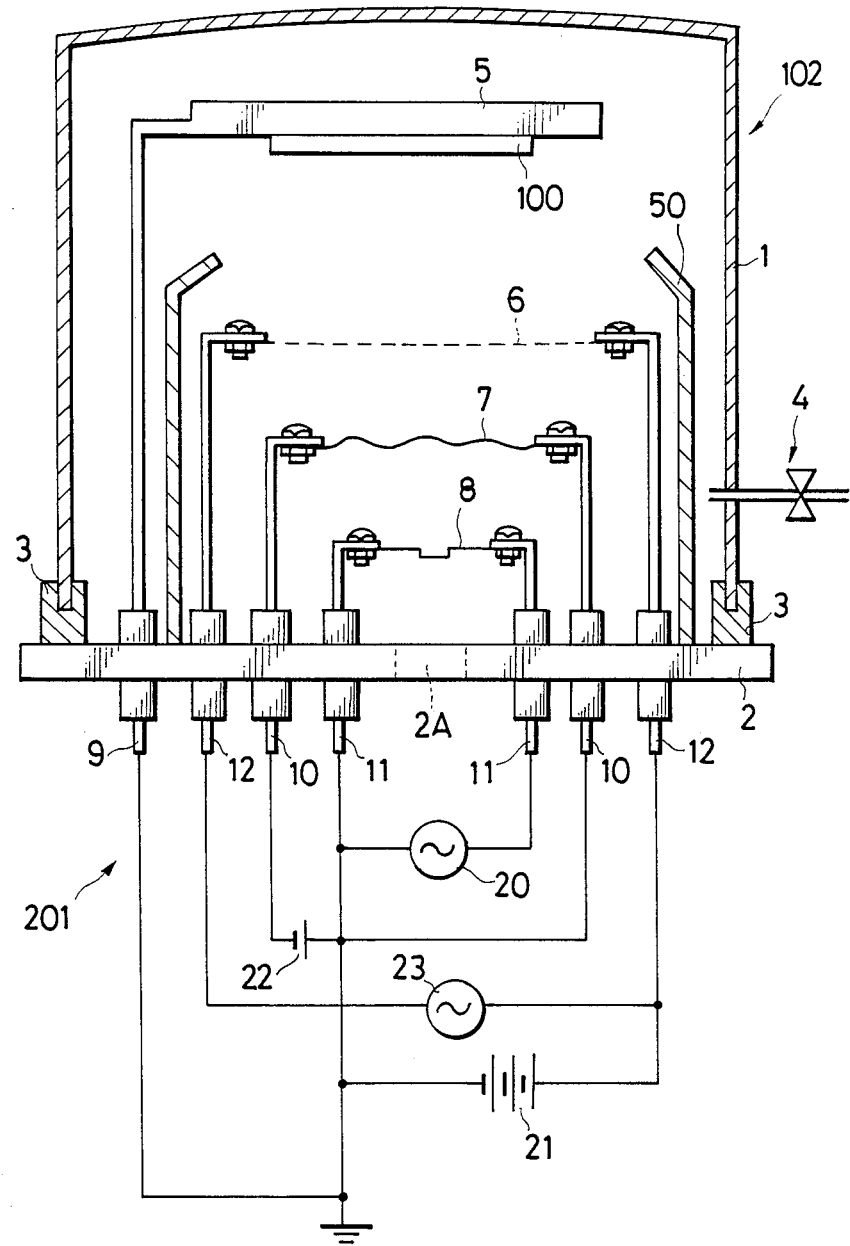
FIG. 5 is a schematic sectional view of a fifth embodiment according to the second apparatus of the present invention.

FIG. 5 shows a fifth embodiment according to the second apparatus of the present invention. In FIG. 5, the same reference numerals are used for the same components as those in FIG. 1, and explanations of such components are omitted.

The vacuum vessel 102 used in the fifth embodiment has a cover 50 which surrounds the source 8, filament 7 and the grid 6 and which is opened only at its side facing the electrode 5. In the thin-film forming process of the fifth embodiment, therefore, the plasma state produced around the grid 6 is held in a quite stable status by virtue of the cover 50. In consequence, no substantial change is caused in the plasma state regardless of any change in the shape, the size and the material of the bell jar 1, whereby a uniform thin film can be formed with a high degree of adhesion to the substrate while the fifth embodiment can be easily adapted to meet the needs of a large-scale production system employing a large bell jar 1 for mass-production of devices having thin films such as semiconductor devices.

The cover 50 may be installed such that an annular gap is left between the bottom thereof and the base plate 2, although in FIG. 5 the cover 50 is attached at its bottom to the base plate 2. The arrangement also may be such that the pairs of electrodes 10, 11 and 12 penetrate the cover 50. In such a case, suitable insulating means is used to provide insulation between the electrodes 10, 11, 12 and the cover 50.

As will be seen from the foregoing description, according to the preferred embodiments of the present invention, it is possible to form a conductive or insulating thin film with a high degree of adhesion to the substrate and in a state which more closely approximates the stoichiometric thin film than those produced by known techniques. In addition, it is possible to form a plurality of thin films in sequence in the same apparatus. Furthermore, according to the preferred embodiments of the present invention, the evaporated substance is ionized to have high level of electrical energy so that the thin film can be formed without requiring any additional thermal energy such as a film-forming heat or a crystallizing heat to be supplied. Thus, it is possible to form a thin film at a low temperature, contributing to the safety of the apparatus itself and enabling a thin film formation on a substrate made of a small heat-resistance material such as plastics.

In particular, the apparatus of the fourth embodiment is suitable for use in a large-scale system for mass-production.

Many widely different embodiments of the present invention may be constructed without departing from the spirit and scope of the present invention. It should be understood that the present invention is not limited to the specific embodiments described in this specification, except as defined in the appended claims.

What is claimed is:

1. An apparatus for forming a thin film comprising:
a vacuum container evacuated to high vacuum and receiving a gas for vapor deposition therein;
a source of evaporation disposed in said container for evaporating a substance to be evaporated;
a counter electrode disposed in said container and holding a substrate to be vapor-deposited such that said substrate opposes said source;
a filament disposed between said source and said electrode for generating thermions;
a grid disposed between said filament and said electrode for allowing said evaporated substance to pass therethrough and accelerating said evaporated substance;
an electrical potential power supply connected to said electrode, said filament and said grid for maintaining said grid at a positive potential with respect to said electrode and said filament; and
an electrical heating power supply connected to said grid for supplying said grid with an electrical power so as to electrically heat said grid.

2. An apparatus according to claim 1, wherein said gas comprises an active gas, an inert gas or a mixture of said active gas and said inert gas.

3. An apparatus according to claim 1, wherein said heating power supply comprises an A.C. power supply.

4. An apparatus according to claim 1, wherein said heating power supply comprises a D.C. power supply.

5. An apparatus according to claim 1, wherein said heating power supply and said potential power supply are connected in parallel to said grid.

6. An apparatus according to claim 5, wherein said heating power supply and said potential power supply are alternatively connected to said grid by a switch.

7. An apparatus according to claim 1, wherein said heating power supply and said potential power supply are connected in series to said grid.

8. An apparatus according to claim 1, wherein said heating power supply and said potential power supply comprise a common D.C. power supply.

9. An apparatus for forming a thin film comprising:
 a vacuum container evacuated to high vacuum and receiving a gas for vapor deposition therein;
 a source of evaporation disposed in said container for evaporating a substance to be evaporated;
 a counter electrode disposed in said container and holding a substrate to be vapor-deposited such that said substrate opposes said source;
 a filament disposed between said source and said electrode for generating thermions;
 a grid disposed between said filament and said electrode for allowing said evaporated substance to pass therethrough and accelerating said evaporated substance;
 an electrical potential power supply connected to said electrode, said filament and said grid for maintaining said grid at a positive potential with respect to said electrode and said filament;
 an electrical heating power supply connected to said grid for supplying said grid with an electrical power so as to electrically heat said grid; and
 a cover disposed in said container for surrounding said source, said filament, and said grid, said cover provided with an opening at a side facing said electrode.

* * * * *